(12) United States Patent
Chiu (10) Patent No.: US 6,564,360 B2
(45) Date of Patent: May 13, 2003

(54) STATIC TIMING ANALYSIS METHOD FOR A CIRCUIT USING GENERATED CLOCK

(75) Inventor: You-Ming Chiu, Taipei (TW)

(73) Assignee: VIA Technologies, Inc., Taipei (TW)

( * ) Notice: Subject to any disclaimer, the term of this patent is extended or adjusted under 35 U.S.C. 154(b) by 0 days.

(21) Appl. No.: 09/987,944

(22) Filed: Nov. 16, 2001

(65) Prior Publication Data

US 2002/0070775 A1 Jun. 13, 2002

(30) Foreign Application Priority Data

Dec. 13, 2000 (TW) ........................... 89126650 A (51) Int. Cl.$^7$ ............................................... G06F 17/50
(52) U.S. Cl. ............................... 716/6; 716/5; 716/18
(58) Field of Search ................. 716/1–6, 18; 703/19

(56) References Cited

U.S. PATENT DOCUMENTS

| | | | | |
|---|---|---|---|---|
| 4,924,430 A | * | 5/1990 | Zasio et al. ................ | 716/6 |
| 5,812,561 A | * | 9/1998 | Giles et al. ................ | 714/726 |
| 6,023,568 A | * | 2/2000 | Segal ......................... | 716/6 |
| 6,173,435 B1 | * | 1/2001 | Dupenloup ................ | 716/18 |
| 6,237,127 B1 | * | 5/2001 | Craven et al. ............. | 716/6 |
| 6,430,731 B1 | * | 8/2002 | Lee et al. .................. | 716/6 |

* cited by examiner

Primary Examiner—Matthew Smith
Assistant Examiner—Paul Dinh
(74) Attorney, Agent, or Firm—Rabin & Berdo P.C.

(57) ABSTRACT

A static timing analysis method on a circuit using generated clock, so as to solve the issues that the conventional static timing analysis cannot be performed on the circuit of flip-flop and the latch using generated clock. By the method of the invention, the user can promptly known whether or not the signal path with respect to the flip-flop and latch has timing violation, whereby the correctness of the clock used in the circuit can be judged.

36 Claims, 7 Drawing Sheets

STATIC TIMING ANALYSIS METHOD FOR A CIRCUIT USING GENERATED CLOCK

CROSS REFERENCE TO RELATED APPLICATION

This application claims the priority benefit of Taiwan application serial no. 89126650, filed Dec. 13, 2000.

BACKGROUND OF THE INVENTION

1. Field of the Invention

This invention relates to a static timing analysis method for a circuit using generated clock. Particularly, this invention is directed to a static timing analysis method for flip-flop (FF) or latch, which use generated clock.

2. Description of Related Art

For the software design tools associating with computer auxiliary used in the current integrated circuit design, when the user accomplishes the circuit design, the computer auxiliary design software would proceeds various analyses, so as to ensure that the designed circuit is a circuit which can work properly, wherein a tool of timing analysis is widely used for predicting the performance and accuracy for the circuit.

The timing analysis is generally categorized into two types of dynamic timing analysis and static timing analysis (STA). About the performance of the simulated circuit, the dynamic timing analysis provides the most detailed and accurate related information. However, it takes a long time to simulate. Contrary to the dynamic timing analysis, the STA provides a saving time method to predict the performance of circuit, whereby it can be determined that whether or not the time sequence of circuit is correctly working under design expectation. The STA provides the complete timing path validation, but also fast find out the critical path where timing violation may occur.

Figure 1:
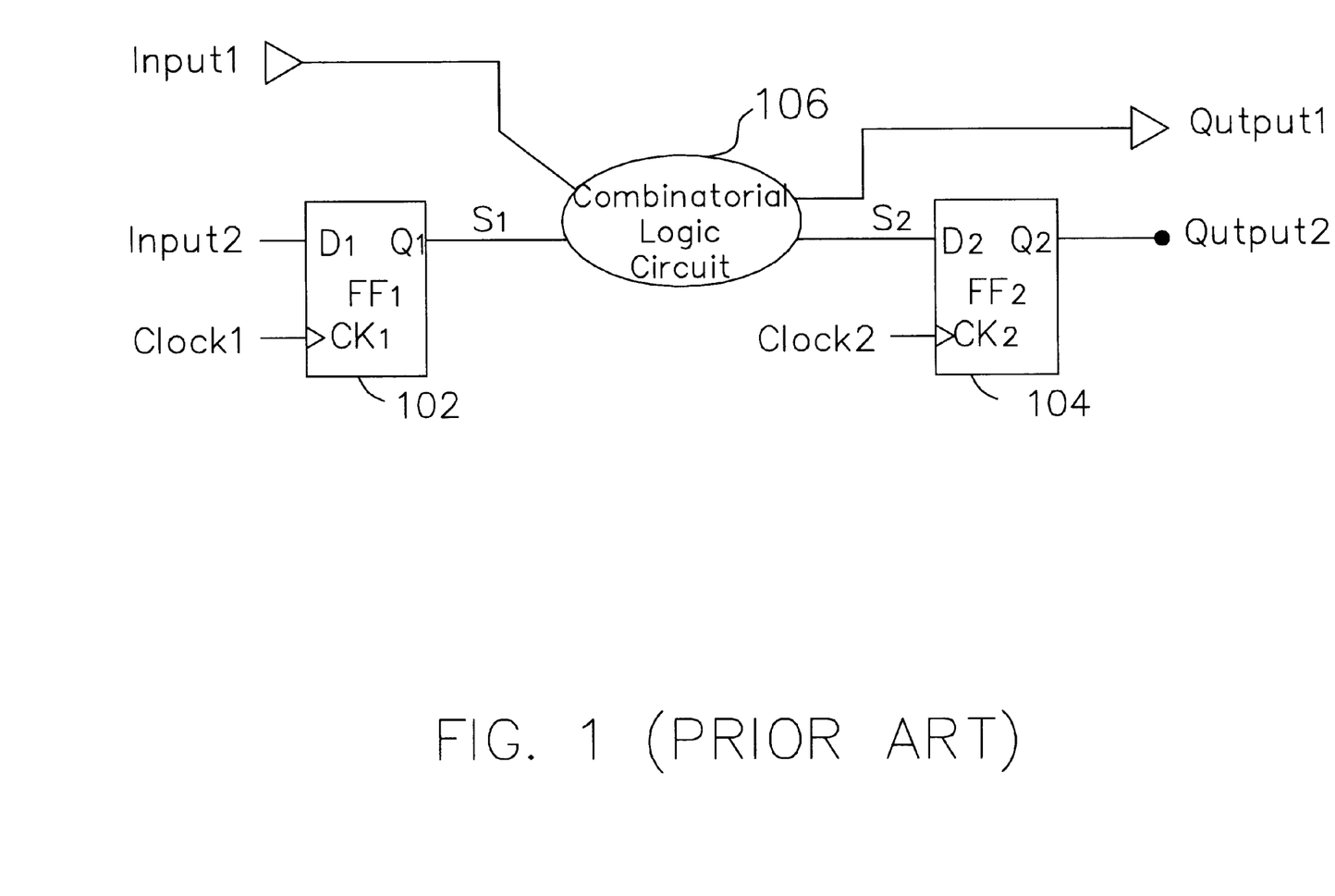
FIG. 1 is a drawing, schematically illustrating a logic circuit diagram used in a conventional static timing analysis.

Referring to FIG. 1, it illustrates a conventional circuit diagram for a logic circuit using STA manner. All the logic circuits connected between the FF 102 and FF 104 are represented as a combinatorial logic circuit 106. The FF 102 is used for receiving input signal Input2 and the clock signal Clock1, and exporting a signal S1 to the combinatorial logic circuit 106. In addition, the combinatorial logic circuit 106 further receives an input signal Input1 and exports a signal S2 and an output signal Output1. The FF 104 is used to receive the signal S2 and the clock signal Clock2, and export the output signal Output2.

The STA is directed to a timing analysis performed on the all signals propagated on the signal propagation paths from the beginning terminal to the last terminal. Any one of the signal propagation paths occurring timing violation is reported. The beginning terminal is referred to an input port or a clock pin and the last terminal is referred to the output port or the signal of the flip-flop. In FIG. 1, the signal propagation path includes, for example, the following four paths: (1) signal propagation path between the input signal Input1 and the output signal Output1; (2) signal propagation path between the input signal Input1 and the signal S2; (3) signal propagation path between the signal S1 and the output signal Output1; and (4) signal propagation path between the signal S1 and the signal S2. The STA can be used to verify whether or not the four signal propagation paths satisfy the timing requirement. If the requirement is satisfied, it means that there is no timing violation occurring.

Whiling performing the STA on the circuit shown in FIG. 1, the STA can be completely performed, if the clock s CK1 and CK2 of the flip-flop 102 and 104 are applied with clock signals clock1 and clock2, which both are a primary clock with regular cycle or a defined clock according to the primary clock. However, when the clock terminal CK2 of the flip-flop 104 is applied with a clock signal clock2 as a generated clock, the conventional computer auxiliary design tool then cannot proceed the STA. This is because all the clock signals used in the computer auxiliary design tool for the circuit to be tested by STA have to be well defined, whereby the STA can be proceeded. In other words, the conventional STA needs to use the clock signals that are well defined, such as a clock signal with a fixed frequency and fixed waveform. However, when the clock signal clock2 is a generated clock, the generated clock is not a well-defined clock signal. The clock signal clock2 cannot be defined out before the clock signal clock2 is used to perform the STA. Therefore, when the clock signal the clock2 is a generated clock, the conventional STA cannot be performed. Thus, the user cannot recognize whether or not a timing violation occurs on the signal path, such as the fourth path, and can only obtain the operation of the circuit by the manner of dynamic timing analysis that is time consuming. Or, the user has to find out the signal paths, which possibly have timing violation. This is also very time consuming and difficult.

In the foregoing, the generated clock means that a clock signal without regular condition, and can come from any clock signal from the combinatorial logic circuit but not from the primary clock or the defined clock from the primary clock.

In FIG. 1, if a latch replaces the flip-flop 104, the clock input terminal of the latch is also a generated clock, the computer auxiliary design tool can also not report which signal path occurs timing violation. Thus, it is very inconvenient for performing the timing analysis.

SUMMARY OF THE INVENTION

It is therefore an objective of the present invention to provide a static timing analysis method on a circuit using generated clock, so as to solve the issues that the conventional static timing analysis cannot be performed on the a circuit of flip-flop and the latch using generated clock. By the method of the invention, the user can promptly known whether or not the signal path with respect to the flip-flop and latch has timing violation, whereby the correctness of the clock used in the circuit can be judged.

According to the objectives of the invention, the invention provides a method for checking a setup time in a static timing analysis, used to judge whether or not a timing violation occurs on a logic circuit. The logic circuit includes a first sequential logic gate, a second sequential logic gate, a first combinatorial logic circuit, a second combinatorial logic circuit, and a third sequential logic gate. The first sequential logic gate is used to receive a first input signal and a first clock signal, and export a first signal at a first output terminal. The clock signal includes a primary clock or a defined clock based on the primary clock. The second sequential logic gate is used to receive a second input signal and a second clock signal, and export a second signal at a second output terminal. The second clock signal includes a primary clock or a defined clock based on the primary clock. The first combinatorial logic circuit and the second combinatorial logic circuit, respectively, include multiple logic gates. The first combinatorial logic circuit is used to receive the first signal and export a third signal. The second combinatorial logic circuit is used to receive the second signal and export a fourth signal. The third sequential logic gate includes a signal input terminal, a clock input terminal, and a third output terminal. Multiple first signal propagation paths are included between the signal input terminal and the first output terminal, while multiple second signal propagation paths are included between the clock input terminal and the second output terminal. The signal input terminal is used to receive the third signal, and the clock input terminal is used to receive a fourth signal. The third sequential logic gate includes a setup time. The method of checking the setup time includes first finding out a first signal propagation path, which has a maximum sum of propagation delay time of the logic gates. In the foregoing, the maximum one of the sum of propagation delay time of the logic gates is defined as a first maximum delay time. Then, a second signal propagation path with a minimum sum of the propagation delay time of the logic gates is found out. The minimum sum of the propagation delay time of the logic gates is defined as a first minimum delay time. Also and, a judgment is done about whether or not the first maximum delay time is less than the first minimum delay time subtracted by the setup time of the third sequential logic gate. If it is, it stands for that the first signal propagation paths and the second signal propagation paths both have passed a check of the setup time in static timing analysis.

According to another objective of the invention, the invention provides a method of checking a holding time in a static timing analysis, used to judge whether or not a timing violation occurs on a logic circuit. The method of checking a holding time of the invention includes the following steps: first, finding out a first signal propagation path, which has a minimum sum of the propagation delay time of the logic gates. The foregoing minimum sum of the propagation delay time of the logic gates is defined as a second minimum delay time. Then, a second signal propagation path having a maximum sum of the propagating time of the logics is found out, wherein the maximum sum of the propagating time of the logics is defined as a second maximum delay time. Then, it is judged that whether or not the second minimum delay time is greater than the second maximum delay time added with the holding time of the third sequential logic gate. If it is, then it stands for that the first signal propagation paths and the second signal propagation paths both have passed the check of holding time in the static timing analysis.

BRIEF DESCRIPTION OF DRAWINGS

The invention can be more fully understood by reading the following detailed description of the preferred embodiments, with reference made to the accompanying drawings, wherein:

FIG. 6 is a drawing, schematically illustrating a circuit diagram having two flip-flops and several latches connected between;

DETAILED DESCRIPTION OF PREFERRED EMBODIMENTS

The static timing analysis method on a circuit using generated clock of the invention 9 is suitable for use in sequential logic gate of generated clock, such as, the latch or flip-flop. Before describing the features of the invention, the operation principles of latch and flip-flop are described as follows.

Figure 2A:
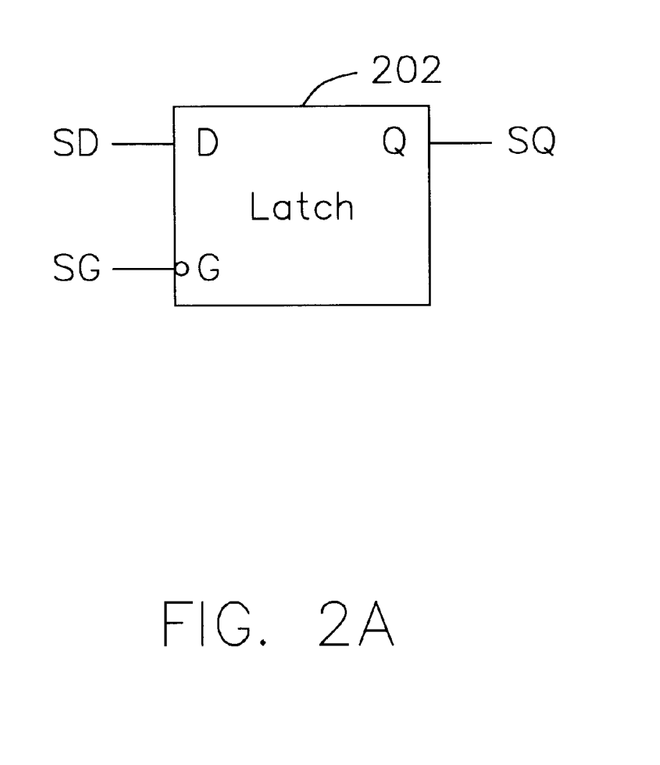
FIGS. 2A–2B are drawings, schematically illustrating a latch and the related waveforms of input and output.
Figure 2B:
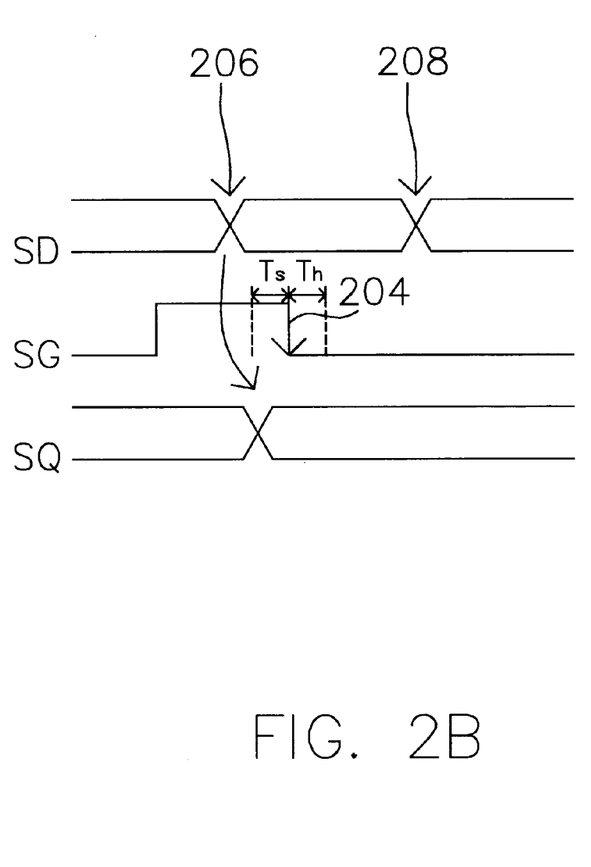

Referring to FIGS. 2A–2B, the latch and its related waveforms of input and output are illustrated. The latch can be a high active type or a low active type. The high active type of latch 202 is used as an example for descriptions. The signal SD is input to the latch 202 at the signal input terminal D. The signal SG is input to the latch 202 at the clock input terminal D. The latch 202 then exports a signal SQ at the signal output terminal Q. The action of the latch 202 is changed according to the voltage level of the signal SG. In other words, when the signal SG has a high voltage level, the latch 202 directly propagates the signal SD to the signal output terminal Q and exports. When the signal SG is at the low voltage level, the latch 202 locks the signal SQ to a fixed level at the output terminal Q. The fixed level is the sampled voltage level of the signal SD at a previous timing point with respect to the falling edge of the locking signal SD. Moreover, the output signal SQ is locked after a fixed delay time. Therefore, the front edge 206 of the signal SD must be in advance from the falling edge 204 of the signal SQ and the post edge 208 of the signal SD must be behind from the falling edge 204 of the signal SG. In this condition, the latch 202 can correctly export.

When one considers the setup time Ts and the holding time Th of the latch 202, the front edge 206 of the signal SD and the falling edge 204 have a time interval of at least the time of Ts. The falling edge 204 and the post edge 208 of the signal SD has a time interval of at least the time of Th. In this condition, the latch 202 can correctly export.

Figure 3A:
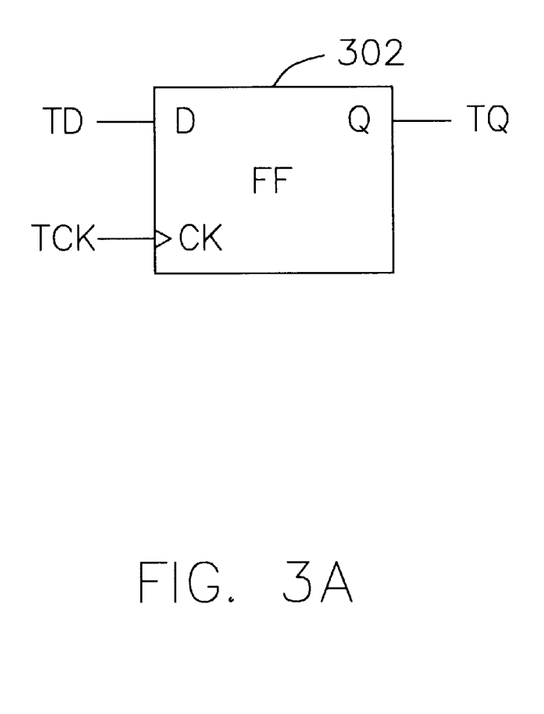
FIGS. 3A–3B are drawings, schematically illustrating a flip-flop and the related waveforms of input and output.
Figure 3B:
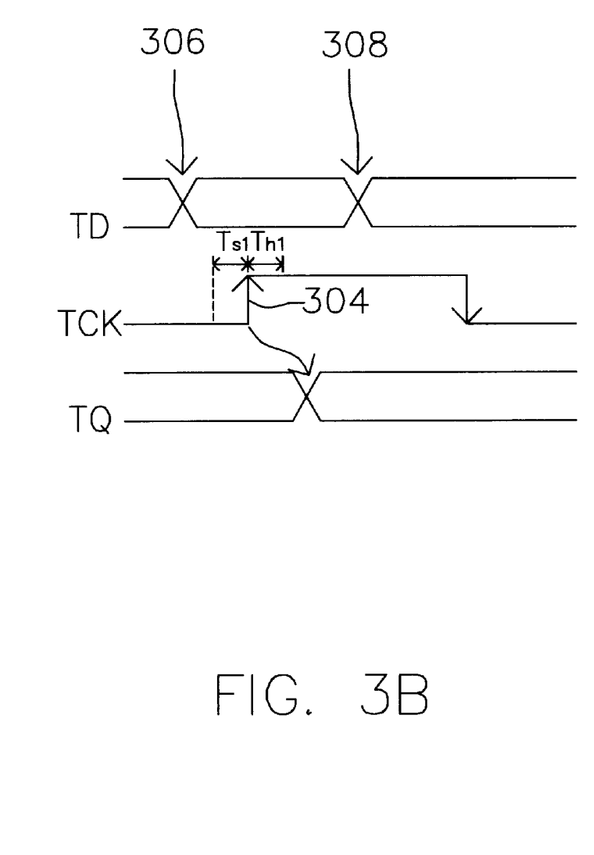

Referring to FIGS. 3A–3B, which are drawings, schematically illustrating a flip-flop and the related waveforms of input and output. The signal TD is input to the flip-flop 302 at the signal input terminal D. The signal TCK is input to the flip-flop 302 at the clock terminal CK. The flip-flop 302 exports a signal TQ at the signal output terminal Q. The flip-flop 302 can be a type of rising edge trigger or a type of falling edge trigger. The flip-flop 302 with the rising edge trigger is used as an example for descriptions. The flip-flop 302 samples the signal TD at the rising edge 304 of signal TCK. After the rising edge of the signal TCK, the signal TQ delays a fixed period of time and is transformed into q voltage level, which is the same as the sampled level of the signal TD. Therefore, the front edge 306 of the signal TD must be in advance from the rising edge 304 of the signal TCK, and the post edge 308 of the signal TD must be behind from the rising edge 304 of the signal TCK. Then, the flip-flop 304 can correctly exports signals.

If one considers the flip-flop 302 having a setup time Ts1, and the holding time Th1, it indicates that the time interval between the front edge 306 of the signal TD and the rising edge 304 has at least the time period of Ts1. The rising edge 304 and the post edge of the signal TD have a time interval of at least the time period of Th1. Then, the flip-flop 304 can correctly exports signals.

Figure 4A:
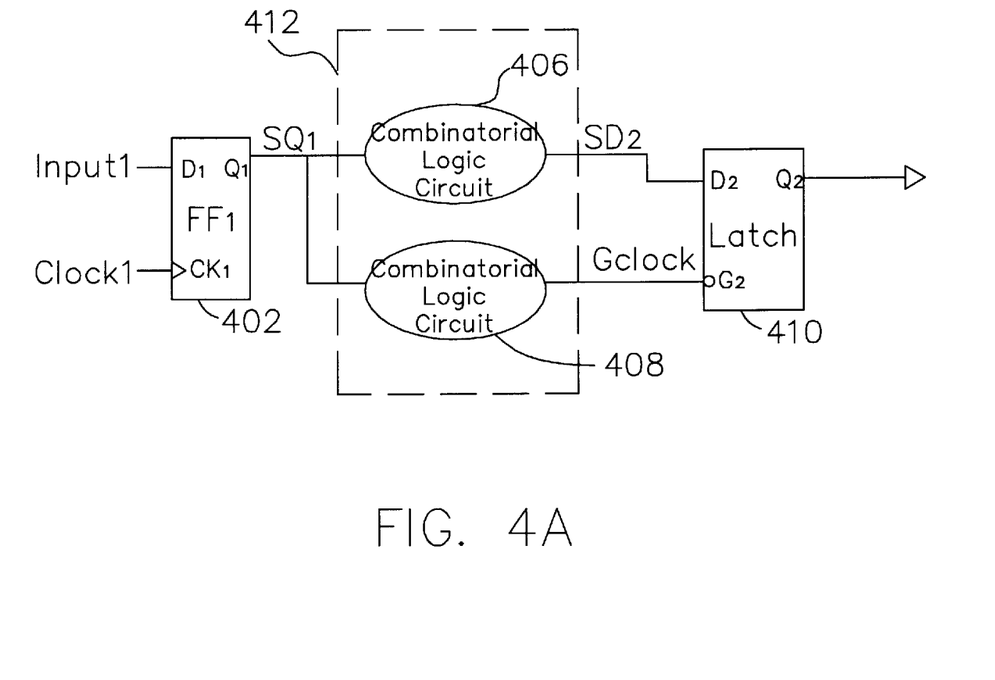
FIG. 4A is a drawing, schematically a circuit diagram about a latch used in a generated clock.

Referring to FIG. 4A, it is a drawing, schematically a circuit diagram about a latch used in a generated clock. The input signal Input1 and clock signal Clock1 are respectively input to the signal input terminal D1 and the clock input terminal CK1 of the flip-flop 402. The signal output from the output terminal Q1 of the flip-flop 402 is respectively input to the combinatorial logic circuits 406 and 408. The combinatorial logic circuits 406 and 408 each include multiple logic gates. The signal SD2 output from the combinatorial logic circuit 406 is input to the latch 410 at the signal input terminal D2. The output signal Gclock output from combinatorial logic circuit 408 is input to the latch 410 at the clock input terminal G2. The kind of circuit uses the output signal of the combinatorial logic circuit 408 as the input signal Gclock at the clock input terminal G2 is called the generated clock. The latch 410 using the generated clock causes that the conventional method cannot detect out whether or not a timing violation occurs on the signal propagation path between the flip-flop 402 and the latch 410, including the paths between the signal output terminal Q1 and the signal input terminal D2 and the paths between the signal output terminal Q1 and the signal input terminal G2. The combinatorial logic circuit 506 and 408 form a combinatorial logic circuit unit 412. The clock signal Clock1 has the primary clock with regular variation, or the primary clock can define out a defined clock. Each logic gate of the combinatorial logic circuit 406 has a propagation delay time.

In FIGS. 2A–2B, the front edge 206 of the signal SD must be in advance from the falling edge 204 of the signal SG. The front edge 206 and the falling edge 204 of the signal SG has time interval of at least the time Ts, so as to assure the latch 202 to have correctly output. According to this principle, the invention can achieve a method of setup time check in static timing analysis using circuit with generated clock. In other words, whether or not a timing violation occurs on the latch 202 can be checked by only comparing the arriving time of the signal SD at the latch 202 with the arriving time of the falling edge 204 of the signal SG at the latch 204.

In FIG. 4A, the flip-flop 402 is coupled to the latch 410 through the combinatorial logic circuits 406 and 408, in which there are several signal propagation paths. One can just find out which one of these signal propagation paths having the longest time for a signal propagating from the signal output terminal Q1 to the signal input terminal D2 of the latch 410 and which one of these signal propagation paths having the shortest time for a falling edge of signal propagating from the signal output terminal Q1 to the clock input terminal G2 of the latch. The results are then compared. Therefore, the method of checking setup time in the invention used in static timing analysis includes following steps:

First, the maximum delay time Tqds1 for a signal in these propagation paths from the signal output terminal Q1 to the signal input terminal D2 of the latch 410 is searched out. In other words, the signal propagation path, which has the maximum sum of propagation time in the logic gates from the signal output terminal Q1 to the signal input terminal D2, is searched out. The maximum sum of the propagation delay time of the logic gates is the maximum delay time Tqds1. Then, when the signal Gclock input to the clock input terminal G2 of the latch 410 is an edge input, wherein the invention uses the edge as a falling edge as an example for descriptions. A minimum delay time Tqgs1 is searched out for a signal propagating from the signal input terminal Q1 to the clock input terminal G2 of the latch 410. In other words, it is to search out the one of the signal propagation path from the signal input terminal Q1 to the clock input terminal G2 of the latch 410 for the falling edge having the minimum sum of the propagation delay time of the logic gates. The minimum sum of the propagation delay time of the logic gates is the minimum delay time Tqgs1. Then, it is judged that whether or not the maximum delay time Tqds1 is less than the minimum delay time Tqgs1 subtracted by the setup time Ts of the latch 410. If it is, it stands for that all the paths from the flip-flop 402 to the latch 410 have passed the setup time check in the static timing analysis. There is no a timing violation occurring.

Likewise in FIGS. 2A–2B, the post edge 208 of the signal SD must be behind from the falling edge 204 of the signal SG, and the time interval between the falling edge 204 and the post edge 208 of the signal SD is at least the time Th, so that the latch 202 can correctly output the signal. According to this principle, the method of the invention for holding time check for the circuit with generated clock in static timing analysis can be obtained. In other words, whether or not a timing violation occurs on the latch 202 can be judged by just comparing the time for the post edge of the signal SD and the arriving time of the falling edge 204 of the signal SG at the latch 202.

In FIG. 4A, the flip-flop 402 is coupled to the latch 410 through the combinatorial logic circuits 406 and 408, wherein there are several signal propagation paths. The shortest time for a signal propagating from the signal output terminal Q1 to the signal input terminal D2 of the latch 410 is search out. The longest time for the falling edge of the signal propagating from the signal output terminal Q1 to the clock input terminal G2 of the latch 410 in the invention is searched out. Then, the shortest time and the longest time are just simply compared. Therefore, the invention provides a method for checking a holding time in a static timing analysis by the following steps.

First, the minimum delay time Tqdh1 is found out from the paths that are from the signal output terminal Q1 of the flip-flop 402 to the signal input terminal D2 of the latch 410. In other words, the signal propagation path with the minimum sum of the propagation delay time in the logic gates is search out. The minimum sum of the propagation delay time in the logic gates is the minimum delay time Tqdh1. Next, with respect to the falling edge of the signal Gclock input at the clock input terminal of the latch 410 the latch 410, the maximum delay time Tqgh1 of the signal from the signal output terminal Q1 to the clock input terminal G2 of the latch 410 is found out. It is finding the signal propagation path for the falling edge of the signal Gclock with the maximum sum of propagation delay time in the logic gates. The maximum sum of propagation delay time in the logic gates is the maximum delay time Tqdh1. Then, it is judged that whether or not the maximum delay time Tqdh1 is greater than the maximum delay time Tqdh1 added with the holding time Th of the latch 410. If it is, it stands for that all the signal paths from the flip-flop 402 to the latch 410 have passed the holding time check in the static timing analysis without timing violation.

Figure 4B:
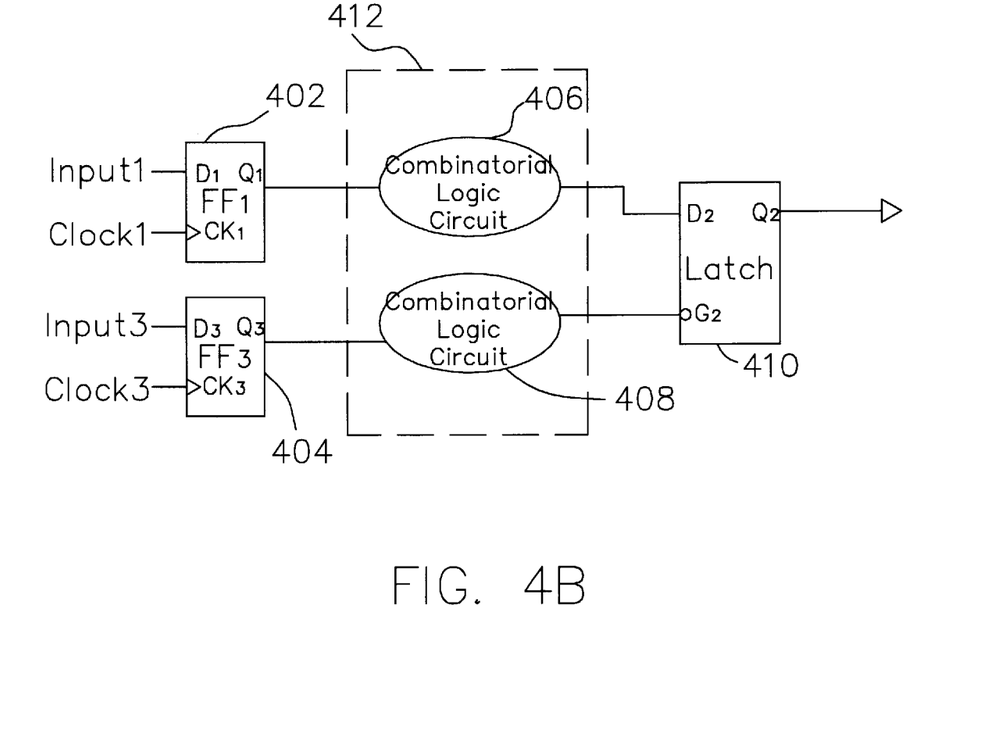
FIG. 4B is a drawing, schematically a circuit diagram about another latch used in a generated clock.

Naturally, the signal SD2 input at the signal input terminal D2 of the latch 410 and the signal Gclock input at the clock input terminal G2 of the latch 410 can come from different flip-flop. FIG. 4B is a drawing, schematically a circuit diagram about another latch used in a generated clock. In FIG. 4B, the combinatorial logic circuits 406 and 408 respectively receive the output signals from the signal output terminal Q1 of the flip-flop 402 and the signal output terminal Q3 of the flip-flop 404. The flip-flop 402 and the flip-flop 404 respectively receive the input signals Input1 and Input 2, and the clock signals Clock1 and Clock2. The clock signals Clock1 and Clock2 are regularly primary clock, or the defined clock defined from the primary clock. Likewise, the static timing analysis of the invention can be used in setup time check and holding time check for signal propagation path from the flip-flops 402 and 404 to the latch 410.

In FIG. 4B, the method of setup time check in static timing analysis includes the following steps:

First, it is finding out the maximum delay time Tqds2 for the signal in the signal propagation paths from the signal output terminal Q1 of the flip-flop 402 to the signal input terminal D2 of the latch 410. Then, with respect to the falling edge of the signal Gclock input at the clock input terminal G2 of the latch 410, the minimum delay time Tqgs2 from the signal output terminal Q3 of the flip-flop 404 to the clock input terminal G2 of the latch 410 is found out. It is judged that whether or not the maximum delay time Tqds2 is smaller than the minimum delay time Tqgs2 subtracted by setup time Ts of the latch 410. If it is, it stands for that all the signal propagation paths from flip-flops 402 and 404 to the latch 410 have passed the setup time check in the static timing analysis without timing violation.

Moreover, in FIG. 4B, the method of holding time check in the static timing analysis in the invention includes the following steps:

First, it is finding out the minimum delay time Tqdh2 for a signal in the signal propagation paths, which are from the signal output terminal Q1 of the flip-flop 402 to the signal input terminal D2 of the latch 410. Then, with respect to the falling edge of the signal Gclock input at the clock input terminal of the latch 410, the maximum delay time Tqgh2 of the signal from the signal output terminal Q3 of the flip-flop 404 to the clock G2 of the latch 410 is found out. Afterward, it is judged that whether the minimum delay time Tqdh2 is greater than the maximum delay time Tqgh2 added with the holding time Th of the letch 410. If it is, it stands for that all the signal propagation paths from the flip-flops 402 and 404 to the latch 410 have passed the holding time check in the static timing analysis without timing violation.

FIG, 4A and FIG. 4B illustrate performing the method of the static timing analysis when the latch is not at transparent mode.

Figure 5A:
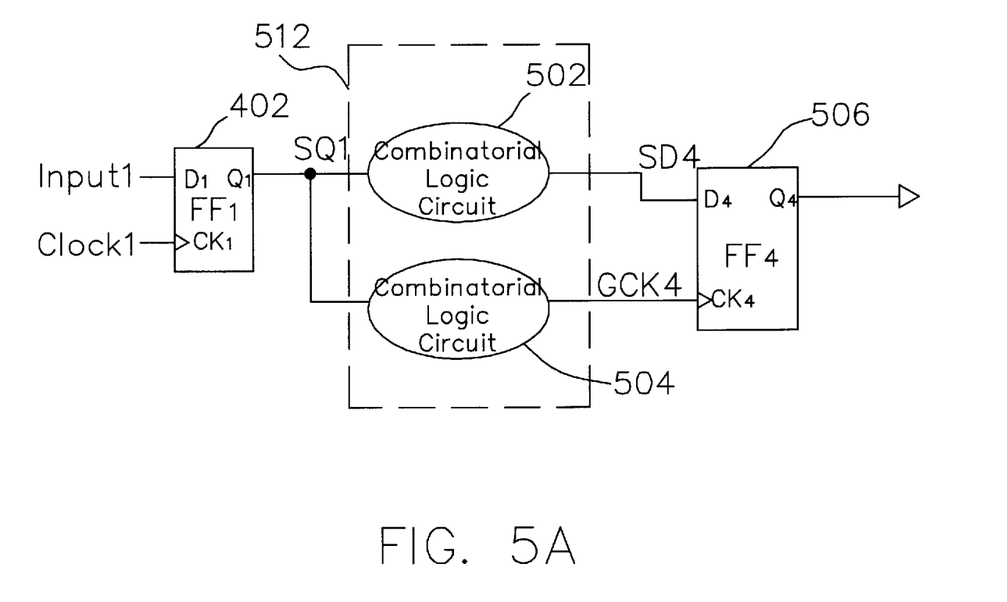
FIG. 5A is a drawing, schematically illustrating a circuit diagram, with respect to FIG. 4A, about a flip-flop used in a generated clock.

FIG. 5A is a drawing, schematically illustrating a circuit diagram, with respect to FIG. 4A, about a flip-flop used in a generated clock. In FIG. 5A, the flip-flop 402 exports a signal SQ1, which separately propagates through the combinatorial logic circuits 502 and 504, and then the signal SD4 and signal GCK4 are obtained. The signal SD4 and signal GCK4 are respectively sent to the signal input terminal D4 and clock input terminal CK4 of the flip-flop 506. When the flip-flop 506 is the type of rising edge trigger, according to FIGS. 3A–3B, front edge 306 of the signal TD must be in advance from the rising edge 304 of the signal TCK, and the time interval between the front edge 306 of the signal TD and the rising edge 304 must be at least the time period of Ts1. Moreover, the post edge 308 of the signal SD must be behind the rising edge 304 of the signal SG, and the time interval between the rising edge 304 and the post edge 308 of the signal TD must be at least the time period of Th1, so that the flip-flop 302 can correctly export. The combinatorial logic circuits 502 and 504 form a combinatorial logic circuit unit 512.

In the foregoing descriptions, the clock signals Clock1 and Clock3 are the primary clocks with regular variation, or the defined clock that is defined from the primary clocks.

Therefore, as shown FIG. 5A, the method of setup time check in static timing analysis of the invention includes the following steps.

First, it is finding out the maximum delay time Tqds3 for the signal in the signal propagation paths from the signal output terminal Q1 of the flip flop 402 to the signal input terminal D4 of the flip-flop 504. Then, with respect to the rising edge of the signal GCK4 input at the clock input terminal CK4 of the flip-flop 506, the minimum delay time Tqgs3 from the signal output terminal Q1 to the clock input terminal CK4 of the flip-flop 506 is found out. Then, It is judged that whether or not the maximum delay time Tqds3 is smaller than the minimum delay time Tqgs3 subtracted by setup time Ts1 of the flip-flop 506. If it is, it stands for that all the signal propagation paths from flip-flop 402 to the flip-flop 506 have passed the setup time check in the static timing analysis without timing violation.

Moreover, as shown in FIG. 5A, the method of holding time check used in static timing analysis of the invention includes the following steps.

First, it is finding out the minimum delay time Tqdh3 for a signal in the signal propagation paths, which are from the signal output terminal Q1 of the flip-flop 402 to the signal input terminal D4 of the flip-flop 506. Then, with respect to the rising edge of the signal GCK4 input at the clock input terminal CK4 of the flip-flop 506, the maximum delay time Tqgh3 of the signal from the signal output terminal Q1 of the flip-flop 506 to the clock input terminal CK4 of the latch 506 is found out. Afterward, it is judged that whether or not the minimum delay time Tqdh3 is greater than the maximum delay time Tqgh3 added with the holding time Th1 of the flip-flop 506. If it is, it stands for that all the signal propagation paths from the flip-flop 402 to the flip-flop 506 have passed the holding time check in the static timing analysis without timing violation.

Figure 5B:
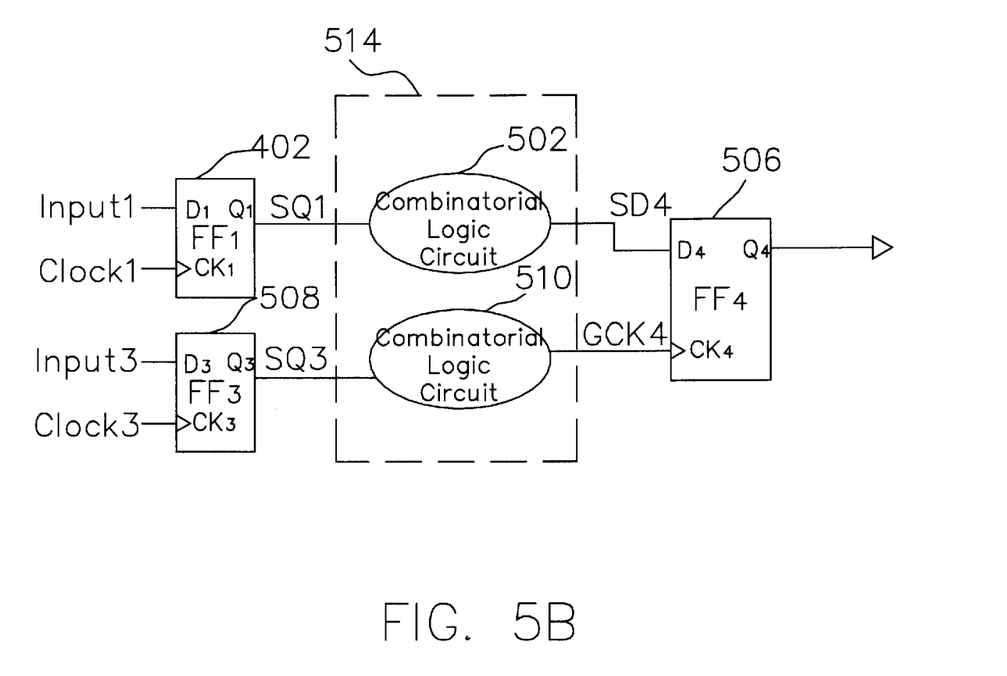
FIG. 5B is a drawing, schematically illustrating a circuit diagram about another flip-flop used in a generated clock.

With the same principle, the combinatorial logic circuits 502 and 510 can receive the signal from different flip-flop, as shown in FIG. 5B, and respectively receive the output signal SQ1 and SQ3 output from the flip-flop 402 and flip-flop 508, wherein the combinatorial logic circuit 502 and 510 form a combinatorial logic circuit unit 514.

As shown in FIG. 5B, the method of setup time check in the static timing analysis of the invention includes: finding out the maximum delay time Tqds4 for the signal in the signal propagation paths from the signal output terminal Q1 of the flip-flop 402 to the signal input terminal D4 of the flip-flop 506. Then, with respect to the rising edge of the signal GCK4 input at the clock input terminal CK4 of the flip-flop 506, the minimum delay time Tqgs4 from the signal output terminal Q3 of the flip-flop 508 to the clock input terminal CK4 of the flip-flop 506 is found out. It is judged that whether or not the maximum delay time Tqds4 is smaller than the minimum delay time Tqgs4 subtracted by setup time Ts1 of the flip-flop 506. If it is, it stands for that all the signal propagation paths from flip-flops 402 and 508 to the flip-flop 506 have passed the setup time check in the static timing analysis without timing violation.

As shown in FIG. 5B, the method of holding time check in the static timing analysis of the invention includes: finding out the minimum delay time Tqdh4 for a signal in the signal propagation paths, which are from the signal output terminal Q1 of the flip-flop 402 to the signal input terminal D4 of the flip-flop 506. Then, with respect to the rising edge of the signal GCK4 input at the clock input terminal CK4 of the flip-flop 506, the maximum delay time Tqgh4 of the signal from the signal output terminal Q3 of the flip-flop 508 to the clock input terminal CK4 of the latch 506 is found out. Afterward, it is judged that whether or not the minimum delay time Tqdh4 is greater than the maximum delay time Tqgh4 added with the holding time Th1 of the flip-flop 506. If it is, it stands for that all the signal propagation paths from the flip-flops 402 and 508 to the flip-flop 506 have passed the holding time check in the static timing analysis without timing violation.

Figure 6:
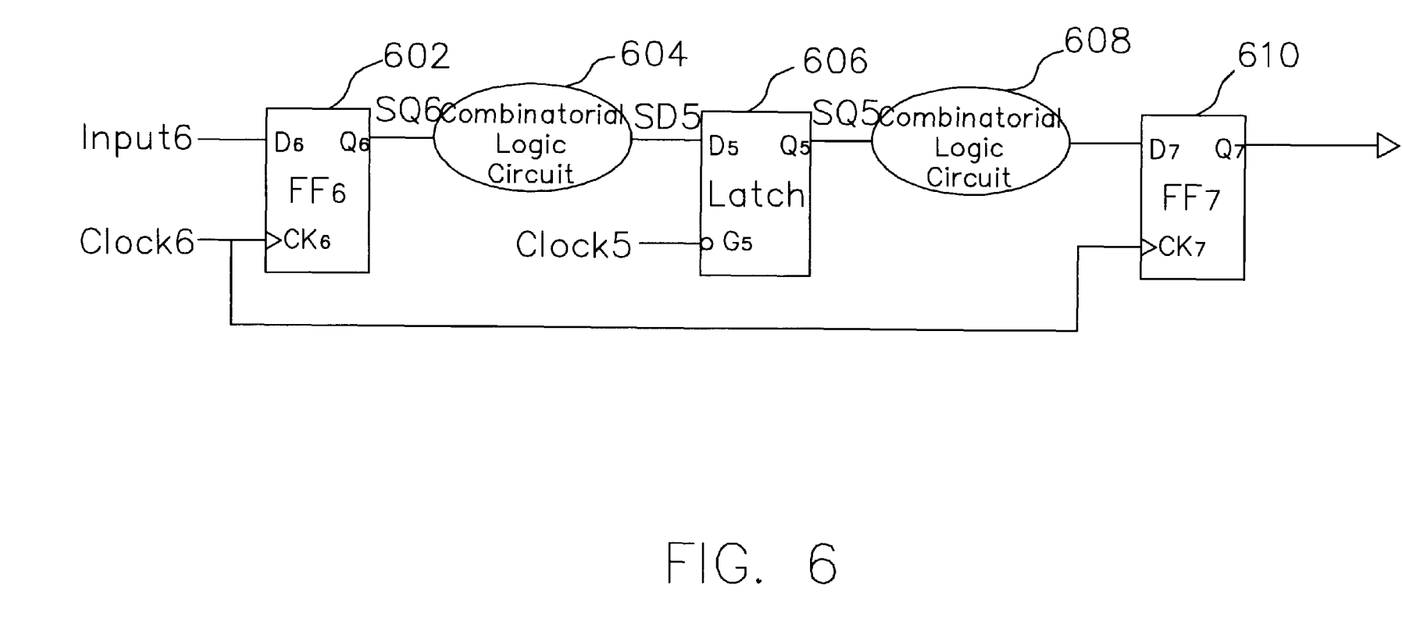

FIG. 6 is a drawing, schematically illustrating a circuit diagram having two flip-flops and several latches connected between. FIG. 6 is to show the static timing analysis of the invention when the latch is at the transparent mode. In FIG. 6, the flip-flop 602 receives the input signal Input6 and the clock signal Clock6, and exports signal SQ6, which also propagates through the combinatorial logic circuit 604, the latch 606, and the combinatorial logic circuit 604, and then to the flip-flop 610. When the clock input terminal G5 of the latch 606 receives the clock signal Clock5, which is at high voltage level, the latch 606 exports the signal SQ5 that is the signal SD5 received by the latch 606 with a delay time period. This is means forgoing transparent mode for the latch 606. In the mean time, the latch 606 can be a part of the combinatorial logic circuits 604 or 608. The static timing analysis between the flip-flop 608 and the flip-flop 610 can use the foregoing analysis method. The clock input terminal CK7 of the flip-flop 610 could receive the clock signal Clock6, as shown in FIG. 6 or receive a generated clock (not shown in FIG. 6).

Figure 7:
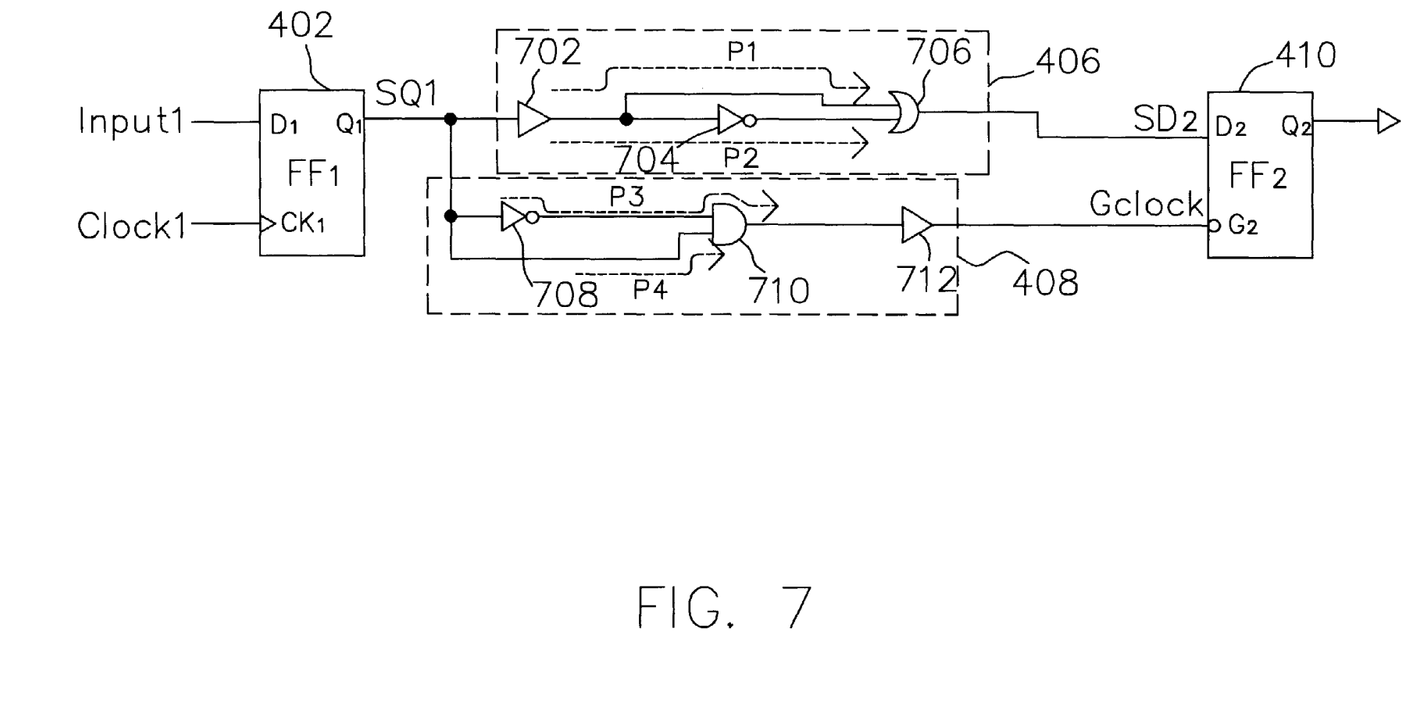
FIG. 7 is a drawing, schematically illustrating an application circuit diagram of the invention with respect to FIG. 4A used in a static timing analysis.

FIG. 7 is a drawing, schematically illustrating an application circuit diagram of the invention with respect to FIG. 4A used in a static timing analysis. The combinatorial logic circuit 406 includes, for example, a buffer 702, phase inverter 704 and OR logic gate 706. The combinatorial logic circuit 408 includes, for example, a phase inverter 708, AND logic gate 710, and buffer 708. The combinatorial logic circuit 406 includes two signal propagation paths, which are indicated as the paths P1 and P2. The combinatorial logic circuit 408 also includes two signal propagation paths, which are indicated as the paths P3 and P4. The signal propagation path P1 is the path connecting the flip-flop 402, the buffer 702, the OR logic gate 706, and the flip-flop 410. The signal propagation path P2 is the path connecting the flip-flop 402, the buffer 702, the phase inverter 704, the OR logic gate 706, and the flip-flop 410. The signal propagation path P3 is the path connecting the flip-flop 402, phase inverter 708, the AND logic gate 710, the buffer 712, and the flip-flop 410. The signal propagation path P4 is the path connecting the flip-flop 402, phase inverter 708, the buffer 712, and the flip-flop 410.

The maximum delay time Tqds1 can be found out by applying the method of setup time check in the static timing analysis, wherein the signal propagation path is from the signal output terminal Q1 of the latch 410 to the signal input terminal D2 of the latch 410. The buffer 702, the phase inverter 704, and the OR logic gate 706 each has a propagation delay time Tb, Ti, and To. After separately computing the sum of the delay time through all the logic gates in the propagation paths P1 and P2, the maximum sum is set to be the maximum delay time Tqds1. For example, the propagation path P2 has the sum of propagation delay time, having Tb+Ti+To for the logic gates.

Next, with respect the falling edge of the signal Gclock input at the clock input terminal G2 of the latch 410, the minimum delay time Tqgs1 for the signal from the signal output terminal Q3 of the flip-flop 404 to the clock input terminal G2 of the latch 410 is found out. When the signal Gclock is at the falling edge, the input of the buffer 712 is also a falling edge. And the corresponding AND logic gate 710 has also the falling edge for input. The corresponding phase inverter 708 has the input with the rising edge. In computing the propagation path P3, the sum of propagation delay time for the logic gates is computed while the rising edge is input to the phase inverter 708 until the buffer 712 is input by the signal Gclock with falling edge. In computing the propagation path P4, the sum of propagation delay time for the logic gates is computed while the falling edge is input to the AND logic gate until the buffer 712 is input by the signal Gclock with falling edge. The minimum quantity of the delay time is indicated as a minimum delay time Tqgs1.

Then, it is judged that whether or not the maximum delay time Tqds1 is less than the minimum delay time Tqgs1 subtracted by the setup time Ts of the latch 410. If it is, it stands for that all signal propagation paths from the flip-flop 402 to the latch 410 (including the signal propagation paths P1, P2, P3, and P4) has passed the setup time check in static timing analysis without timing violation.

In the foregoing descriptions, the latch is operated in active manner and the flip-flop is a type of rising edge trigger. However, the invention is not limited to this example.

The foregoing preferred embodiment of the invention discloses a static timing analysis method on a circuit using generated clock, so as to solve the issues that the conventional static timing analysis cannot be performed on the a circuit of flip-flop and the latch using generated clock. By the method of the invention, the user can promptly known whether or not the signal path with respect to the flip-flop and latch has timing violation, whereby the correctness of the clock used in the circuit can be judged.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method of setup time check in a static timing analysis for judging whether a timing violation occurs on a logic circuit, said logic circuit having a first sequential logic gate for receiving a first input signal and a first clock signal, and exporting a first signal at a first output terminal, wherein said first clock signal is a primary clock or a defined clock that is defined from said primary clock; a second sequential logic gate for receiving a second input signal and a second clock signal, and exporting a second signal at a second output terminal, wherein said second clock signal is a primary clock or a defined clock that is defined from said primary clock; a combinatorial logic circuit unit, including a plurality of logic gates, said combinatorial logic circuit unit is used to receive said first signal and said second signal, and export a third signal and a fourth signal; and a third sequential logic gate, including a signal input terminal, a clock input terminal, and a third output terminal, wherein a plurality of first signal propagation paths included between said signal input terminal and said first output terminal, a plurality of second signal propagation paths included between said clock input terminal and said second output terminal, said signal input terminal is used to receive said third signal, and said clock input terminal is used to receive said fourth signal, wherein said third sequential logic gate has a setup time; said method of setup time check comprising:

finding out one of said first signal propagation paths, which has a maximum sum of propagation delay time for said logic gates, said maximum sum of propagation delay time for said logic gates is a first maximum delay time;

finding out one of said second signal propagation paths, which has a minimum sum of propagation delay time for said logic gates, said minimum sum of propagation delay time for said logic gates is a first minimum delay time; and judging whether said first maximum delay time is less than said first minimum delay time subtracted by said setup time of said third sequential logic gate, wherein if it is, then said first signal propagation paths and said second signal propagation paths have passed a setup time check in a static timing analysis.

2. The method of setup time check according to claim 1, wherein when said fourth signal is at a first level, said third output terminal exports said third signal, when said fourth signal is at a second level, said third output terminal exports a fixed level with respect to said third signal, and an edge of said fourth signal while changing from said first level to said second level is referred to find out said one of said second signal propagation paths having said minimum sum of propagation delay time for said logic gates.

3. The method of setup time check according to claim 2, wherein said third sequential logic gate is a latch with a high active type, said first level is a high level, and said second level is a low level.

4. The method of setup time check according to claim 2, wherein said third sequential logic gate is a latch with a low active type, said first level is a low level, and said second level is a high level.

5. The method of setup time check according to claim 1, wherein said first sequential logic gate and said second sequential logic gate both are flip-flop's.

6. The method of setup time check according to claim 1, wherein said combinatorial logic circuit unit comprises a first combinatorial logic circuit and a second combinatorial logic circuit, said first combinatorial logic circuit is used to receive said first signal and export said third signal, and said second combinatorial logic circuit is used to receive said second signal and export said fourth signal.

7. The method of setup time check according to claim 1, wherein said third sequential logic gate is a type of rising edge trigger, finding out said one of said second signal propagation paths, which has said minimum sum of propagation delay time for said logic gates with respect to a rising edge of said fourth signal.

8. The method of setup time check according to claim 1, wherein said third sequential logic gate is a type of falling edge trigger, finding out said one of said second signal propagation paths, which has said minimum sum of propagation delay time for said logic gates with respect to a falling edge of said fourth signal.

9. The method of setup time check according to claim 1, wherein said third sequential logic gate is a flip-flop.

10. A method of holding time check in a static timing analysis for judging whether a timing violation occurs on a logic circuit, said logic circuit having a first sequential logic gate for receiving a first input signal and a first clock signal, and exporting a first signal at a first output terminal, wherein said first clock signal is a primary clock or a defined clock that is defined from said primary clock; a second sequential logic gate for receiving a second input signal and a second clock signal, and exporting a second signal at a second output terminal, wherein said second clock signal is a primary clock or a defined clock that is defined from said primary clock; a combinatorial logic circuit unit, including a plurality of logic gates, said combinatorial logic circuit unit is used to receive said first signal and said second signal, and export a third signal and a fourth signal; and a third sequential logic gate, including a signal input terminal, a clock input terminal, and a third output terminal, wherein a plurality of first signal propagation paths included between the signal input terminal and the first output terminal, a plurality of second signal propagation paths included between said clock input terminal and said second output terminal, said signal input terminal is used to receive said third signal, and said clock input terminal is used to receive said fourth signal, wherein said third sequential logic gate has a holding time; said method of holding time check comprising:

finding out one of said first signal propagation paths, which has a minimum sum of propagation delay time for said logic gates, said minimum sum of propagation delay time for said logic gates is a second minimum delay time;

finding out one of said second signal propagation paths, which has a maximum sum of propagation delay time for said logic gates, said maximum sum of propagation delay time for said logic gates is a second maximum delay time; and judging whether said second minimum delay time is greater than said second maximum delay time added with said holding time of said third sequential logic gate, wherein if it is, then said first signal propagation paths and said second signal propagation paths have passed a holding time check in a static timing analysis.

11. The method of holding time check according to claim 10, wherein when said fourth signal is at a first level, said third output terminal exports said third signal, when said fourth signal is at a second level, said third output terminal exports a fixed level with respect to said third signal, and an edge of said fourth signal while changing from said first level to said second level is referred to find out said one of said second signal propagation paths having said minimum sum of propagation delay time for said logic gates.

12. The method of holding time check according to claim 11, wherein said third sequential logic gate is a latch with a high active type, said first level is a high level, and said second level is a low level.

13. The method of holding time check according to claim 11, wherein said third sequential logic gate is a latch with a low active type, said first level is a low level, and said second level is a high level.

14. The method of holding time check according to claim 10, wherein said first sequential logic gate and said second sequential logic gate both are flip-flop's.

15. The method of holding time check according to claim 10, wherein said combinatorial logic circuit unit comprises a first combinatorial logic circuit and a second combinatorial logic circuit, said first combinatorial logic circuit is used to receive said first signal and export said third signal, and said second combinatorial logic circuit is used to receive said second signal and export said fourth signal.

16. The method of holding time check according to claim 10, wherein the third sequential logic gate is a type of rising edge trigger, finding out the one of the second signal propagation paths, which has the maximum sum of propagation delay time for the logic gates with respect to a rising edge of said fourth signal.

17. The method of holding time check according to claim 10, wherein said third sequential logic gate is a type of falling edge trigger, finding out said one of said second signal propagation paths, which has said maximum sum of propagation delay time for said logic gates with respect to a falling edge of said fourth signal.

18. The method of holding time check according to claim 10, wherein said third sequential logic gate is a flip-flop.

19. A method of setup time check in a static timing analysis for judging whether a timing violation occurs on a logic circuit, said logic circuit comprising: a first sequential logic gate for receiving an input signal and a clock signal, and exporting a first signal at a first output terminal, wherein said clock signal is a primary clock or a defined clock that is defined from said primary clock; a combinatorial logic circuit unit, including a plurality of logic gates, said combinatorial logic circuit unit is used to receive said first signal and export a second signal and a third signal; and a second sequential logic gate, including a signal input terminal, a clock input terminal, and a second output terminal, wherein a plurality of first signal propagation paths included between said signal input terminal and said first output terminal, a plurality of second signal propagation paths included between said clock input terminal and said first output terminal, the signal input terminal is used to receive the second signal, and said clock input terminal is used to receive said third signal, wherein said second sequential logic gate has a setup time; said method of setup time check comprising:
    finding out one of said first signal propagation paths, which has a maximum sum of propagation delay time for said logic gates, said maximum sum of propagation delay time for said logic gates is a first maximum delay time;
    finding out one of said second signal propagation paths, which has a minimum sum of propagation delay time for said logic gates, said minimum sum of propagation delay time for said logic gates is a first minimum delay time; and
    judging whether said first maximum delay time is less than said first minimum delay time subtracted by said setup time of said second sequential logic gate, wherein if it is, then said first signal propagation paths and said second signal propagation paths have passed a setup time check in a static timing analysis.

20. The method of setup time check according to claim 19, wherein said combinatorial logic circuit unit comprises a first combinatorial logic circuit and a second combinatorial logic circuit, said first combinatorial logic circuit is used to receive said first signal and export said second signal, and said second combinatorial logic circuit is used to receive said first signal and export said third signal.

21. The method of setup time check according to claim 19, wherein when said third signal is at a first level, said second output terminal exports said second signal, when said third signal is at a second level, said second output terminal exports a fixed level with respect to said second signal, and an edge of said third signal while changing from said first level to said second level is referred to find out the one of said second signal propagation paths having said minimum sum of propagation delay time for said logic gates.

22. The method of setup time check according to claim 21, wherein said second sequential logic gate is a latch with a low active type, said first level is a high level, and said second level is a low level.

23. The method of setup time check according to claim 21, wherein said second sequential logic gate is a latch with a low active type, said first level is a low level, and said second level is a high level.

24. The method of setup time check according to claim 19, wherein the first sequential logic gate is a flip-flop.

25. The method of setup time check according to claim 19, wherein the second sequential logic gate is a type of rising edge trigger, finding out the one of the second signal propagation paths, which has said minimum sum of propagation delay time for said logic gates with respect to a rising edge of said third signal.

26. The method of setup time check according to claim 19, wherein said second sequential logic gate is a type of falling edge trigger, finding out said one of said second signal propagation paths, which has said minimum sum of propagation delay time for said logic gates with respect to a falling edge of said third signal.

27. The method of setup time check according to claim 19, wherein said second sequential logic gate is a flip-flop.

28. A method of holding time check in a static timing analysis for judging whether a timing violation occurs on a logic circuit, the logic circuit having a first sequential logic gate for receiving an input signal and a clock signal, and exporting a first signal at a first output terminal, wherein said clock signal is a primary clock or a defined clock that is defined from said primary clock; a combinatorial logic circuit unit, including a plurality of logic gates, said combinatorial logic circuit unit is used to receive said first signal and export a second signal and a third signal; and a second sequential logic gate, including a signal input terminal, a clock input terminal, and a second output terminal, wherein a plurality of first signal propagation paths included between said signal input terminal and said first output terminal, a plurality of second signal propagation paths included between said clock input terminal and said first output terminal, said signal input terminal is used to receive said second signal, and said clock input terminal is used to receive said third signal, wherein said second sequential logic gate has a holding time; said method of holding time check comprising:
    finding out one of said first signal propagation paths, which has a minimum sum of propagation delay time for said logic gates, said minimum sum of propagation delay time for said logic gates is a second minimum delay time;
    finding out one of said second signal propagation paths, which has a maximum sum of propagation delay time for said logic gates, said maximum sum of propagation delay time for said logic gates is a second maximum delay time; and
    judging whether said second minimum delay time is greater than said second maximum delay time subtracted by said holding time of said second sequential logic gate, wherein if it is, then said first signal propagation paths and said second signal propagation paths have passed a holding time check in a static timing analysis.

29. The method of holding time check according to claim 28, wherein the combinatorial logic circuit unit comprises a first combinatorial logic circuit and a second combinatorial logic circuit, said first combinatorial logic circuit is used to receive said first signal and export said second signal, and said second combinatorial logic circuit is used to receive said first signal and export said third signal.

30. The method of holding time check according to claim 28, wherein when said third signal is at a first level, said second output terminal exports said second signal, when said third signal is at a second level, said second output terminal exports a fixed level with respect to the second signal, and an edge of the third signal while changing from said first level to said second level is referred to find out the one of said second signal propagation paths having said maximum sum of propagation delay time for said logic gates.

31. The method of holding time check according to claim 30, wherein said second sequential logic gate is a latch with a low active type, said first level is a high level, and said second level is a low level.

32. The method of holding time check according to claim 30, wherein said second sequential logic gate is a latch with a low active type, said first level is a low level, and said second level is a high level.

33. The method of holding time check according to claim 28, wherein said first sequential logic gate is a flip-flop.

34. The method of holding time check according to claim 28, wherein said second sequential logic gate is a type of rising edge trigger, finding out said one of said second signal propagation paths, which has said maximum sum of propagation delay time for said logic gates with respect to a rising edge of said third signal.

35. The method of holding time check according to claim 28, wherein said second sequential logic gate is a type of falling edge trigger, finding out said one of said second signal propagation paths, which has said maximum sum of propagation delay time for said logic gates with respect to a falling edge of said third signal.

36. The method of holding time check according to claim 28, wherein said second sequential logic gate is a flip-flop.

\* \* \* \* \*